United States Patent
Mane et al.

(10) Patent No.: US 12,266,752 B2
(45) Date of Patent: Apr. 1, 2025

(54) MODIFICATION OF LITHIUM ION ELECTRODE MATERIALS VIA ATOMIC LAYER DEPOSITION TECHNIQUES

(71) Applicant: UCHICAGO ARGONNE, LLC, Chicago, IL (US)

(72) Inventors: Anil U. Mane, Naperville, IL (US); Jason R. Croy, Plainfield, IL (US); Jeffrey W. Elam, Elmhurst, IL (US); Arturo Gutierrez, Naperville, IL (US); Jihyeon Gim, Naperville, IL (US); Devika Choudhury, Naperville, IL (US); Eungje Lee, Naperville, IL (US); Hakim Iddir, Elmhurst, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 948 days.

(21) Appl. No.: 16/855,676

(22) Filed: Apr. 22, 2020

(65) Prior Publication Data

US 2021/0336240 A1    Oct. 28, 2021

(51) Int. Cl.
| | |
|---|---|
| *H01M 4/04* | (2006.01) |
| *C23C 16/455* | (2006.01) |
| *H01M 4/02* | (2006.01) |
| *H01M 4/36* | (2006.01) |
| *H01M 4/48* | (2010.01) |
| *H01M 4/525* | (2010.01) |
| *H01M 10/0525* | (2010.01) |

(52) U.S. Cl.
CPC ..... *H01M 4/0428* (2013.01); *C23C 16/45555* (2013.01); *H01M 4/366* (2013.01); *H01M 4/483* (2013.01); *H01M 4/525* (2013.01); *H01M 10/0525* (2013.01); *H01M 2004/028* (2013.01)

(58) Field of Classification Search
CPC .... H01M 4/0428; H01M 4/366; H01M 4/483; H01M 4/525; H01M 10/0525; H01M 2004/028; C23C 16/45555
See application file for complete search history.

(56) References Cited

U.S. PATENT DOCUMENTS

| | | | |
|---|---|---|---|
| 8,906,449 B2 | 12/2014 | Li et al. | |
| 2012/0301778 A1* | 11/2012 | Trevey | H01M 4/386 429/231.95 |
| 2014/0008568 A1 | 1/2014 | Fujdala et al. | |
| 2016/0351973 A1 | 12/2016 | Albano et al. | |

(Continued)

FOREIGN PATENT DOCUMENTS

| | | | | |
|---|---|---|---|---|
| EP | 3026738 A1 * | 6/2016 | | C01G 53/50 |
| WO | WO-2016/025866 A1 | 2/2016 | | |
| WO | WO-2020/257176 A1 | 12/2020 | | |

OTHER PUBLICATIONS

Croy, et al., "Prospects for spinel-stabilized, high-capacity lithium-ion battery cathodes," Journal of Power Sources 334, pp. 213-220 (2016).

(Continued)

*Primary Examiner* — Niki Bakhtiari
*Assistant Examiner* — Niara Trant
(74) *Attorney, Agent, or Firm* — Foley & Lardner LLP

(57) ABSTRACT

A method for coating of lithium ion electrode materials via atomic layer deposition. The coated materials may be integrated in part as a dopant in the electrode itself via heat treatment forming a doped lithium electrode.

12 Claims, 4 Drawing Sheets

(56) References Cited

U.S. PATENT DOCUMENTS

| | | |
|---|---|---|
| 2017/0338522 A1 | 11/2017 | Hu et al. |
| 2019/0103231 A1 | 4/2019 | Chai et al. |
| 2020/0052326 A1 | 2/2020 | Hu et al. |
| 2020/0119342 A1* | 4/2020 | Watanabe .............. H01M 4/525 |
| 2021/0234153 A1* | 7/2021 | Xiao ..................... H01M 4/366 |

OTHER PUBLICATIONS

Long, et al., "Advances in Stabilizing 'Layered-Layered' xLi2MnO3 x (1-x)LiMO2 (M=Mn, Ni, Co) Electrodes with a Spinel Component," Journal of the Electro Chemical Society 161(14), pp. A2160-A2167 (2014).

Wang, et al., "Synthesis of high capacity cathodes for lithium-ion batteries by morphology-tailored hydroxide co-precipitation," Journal of Power Sources 274, pp. 451-457 (2015).

"Global EV Outlook 2021," International Energy Agency, retrieved from https://www.iea.org/reports/global-ev-outlook-2021 on Nov. 15, 2022, 101 pages (2021).

Bi, et al., "Stability of Li2CO3 in cathode of lithium ion battery and its influence on electrochemical performance," RSC Advances 6(23), pp. 19233-19237 (2016).

Buechel, et al., "Electrical vehicles (EV) battery supply chain: Country risks and lithium supply," S&P Global Market Intelligence, retrieved from https://www.spglobal.com/marketintelligence/en/mi/research-analysis/electric-vehicles-supply-chain-country-risks-lithium-supply.html on Nov. 15, 2022, 7 pages (2021).

Butler, et al., "Development Status of the Metal Oxide Regenerable CO2 Removal System for the NASA EMU," SAE Technical Paper 972505, 10 pages (1997).

Chen, et al., "Mechanism for Al2O3 Atomic Layer Deposition on LiMn2O4 from In Situ Measurements and Ab Initio Calculations," Chem 4(10), pp. 2418-2435 (2018).

Darapaneni, et al., "Elucidating the Redox Behavior during Atomic Layer Deposition on Lithium-Ion Battery Cathode Materials," Chemistry of Materials 33(20), pp. 8079-8088 (2021).

Gutierrez, et al., "Multifunctional Films Deposited by Atomic Layer Deposition for Tailored Interfaces of Electrochemical Systems," Journal of the Electrochemical Society 167(14):140541 (2020) (24 page accepted manuscript provided).

Han, et al., "Negating interfacial impedance in garnet-based solid-state Li metal batteries," Nature Materials 16, pp. 572-579 (2017) (advanced online publication provided; 9 pages).

Kang, et al., "Modification of LiMn2O4 surfaces by controlling the Acid-Base surface chemistry of atomic layer deposition," Applied Surface Science 599:153329 (2022) (45 page accepted manuscript provided).

Park, et al., "Ultrathin Lithium-Ion Conducting Coatings for Increased Interfacial Stability in High Voltage Lithium-Ion Batteries," Chemistry of Materials 26(10), pp. 3128-3134 (2014).

Young, et al., "High-Rate Spinel LiMn2O4 (LMO) Following Carbonate Removal and Formation of Li-Rich Interface by ALD Treatment," The Journal of Physical Chemistry C 123(39), 23783-23790 (2019).

\* cited by examiner

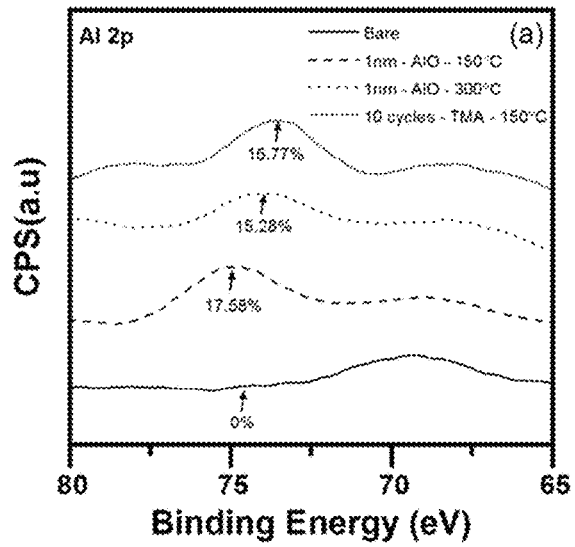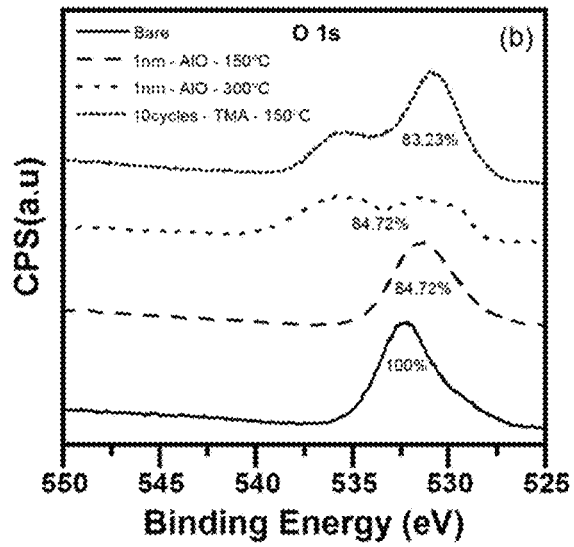
FIG. 1A
FIG 1B
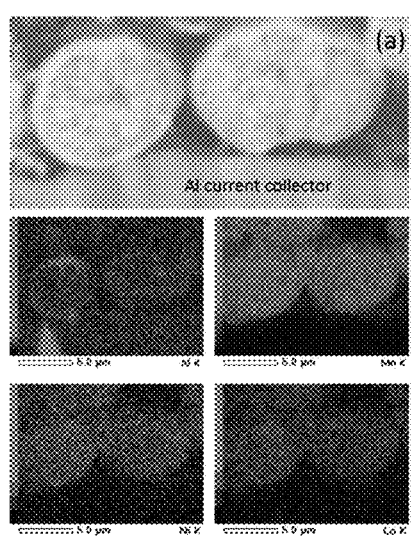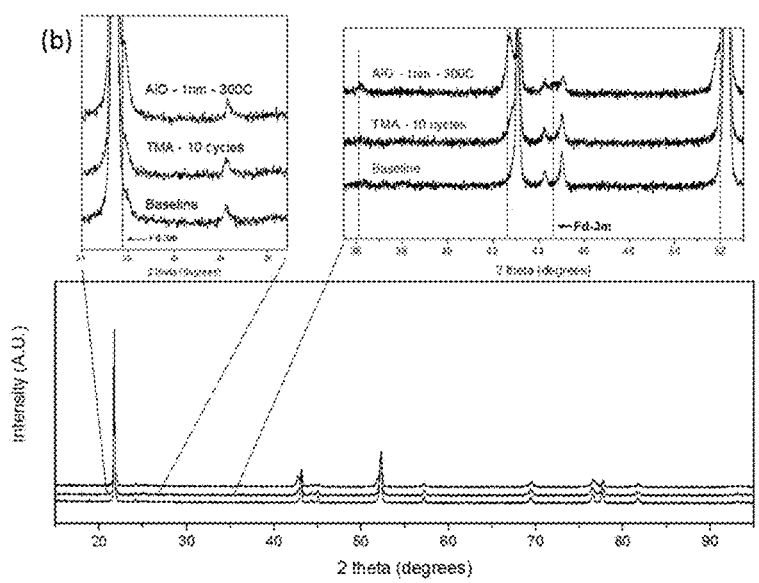
FIG. 2A
FIG. 2B

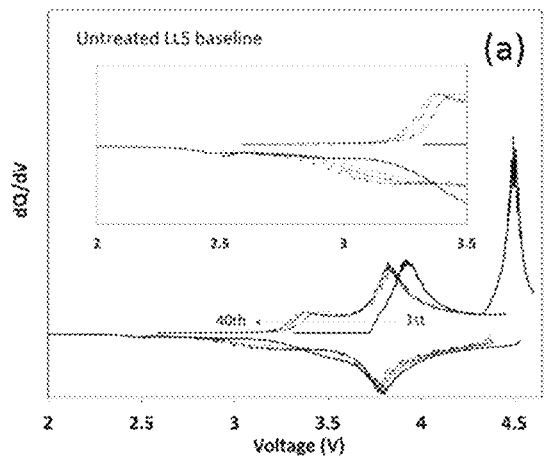
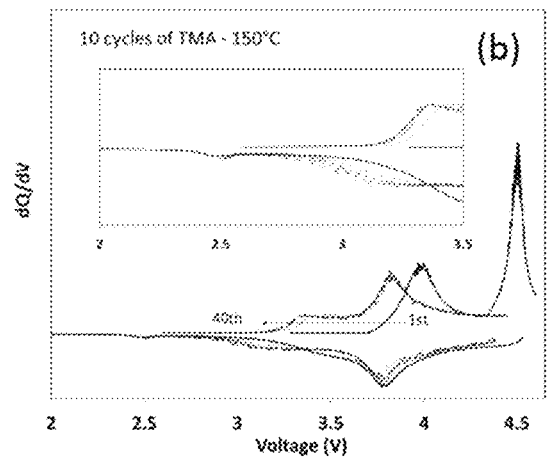
FIG. 3A
FIG. 3B
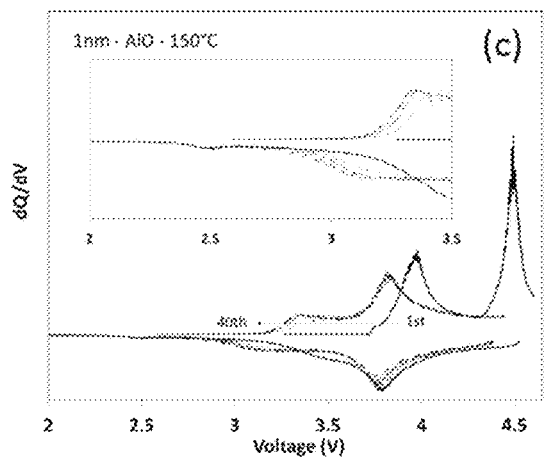
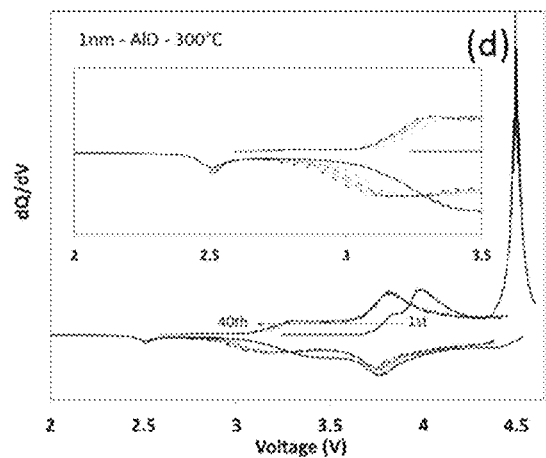
FIG. 3C
FIG. 3D
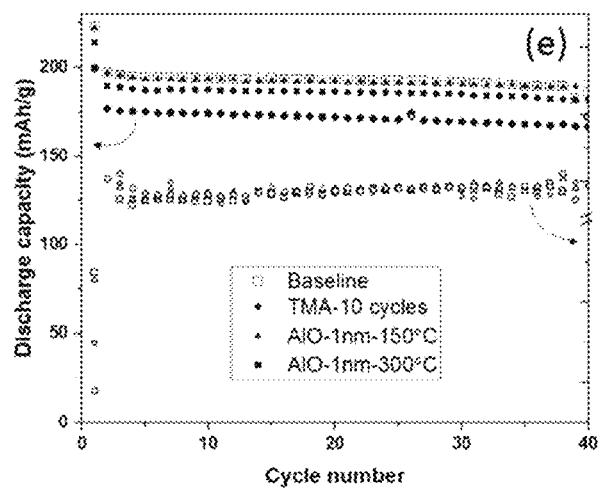
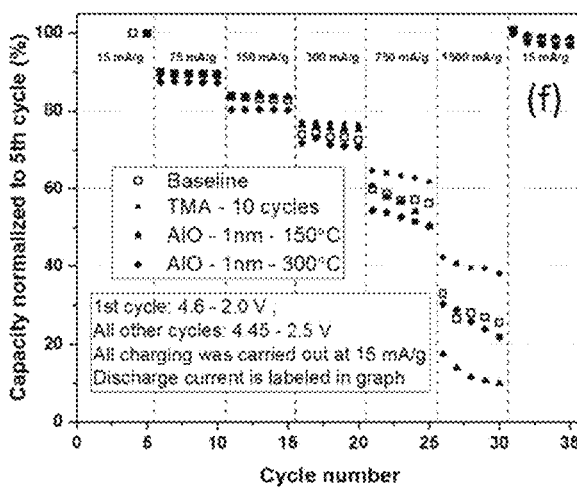
FIG. 3E
FIG. 3F

MODIFICATION OF LITHIUM ION ELECTRODE MATERIALS VIA ATOMIC LAYER DEPOSITION TECHNIQUES

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates to lithium ion materials and method for modifying and synthesizing the same.

BACKGROUND

Lithium ion ("Li-ion") batteries have become a dominant player in the energy storage market. More advanced energy storage options based upon a lithium framework are sought after. As part of that, advanced Li-ion cathodes such as the lithium- and manganese-rich layered-layered-spinels ("LLS") and next-generation, nickel-rich chemistries are being studied for their ability to deliver high energies and capacities.

However, modifications to both surface and bulk properties are necessary in order to further enhance performance (e.g., capacity, rate, impedance, stability, longevity) towards meeting next generation Li-ion battery goals. A traditional strategy has been to dope secondary elements (e.g., Al, Mg, Ti, Ga, Zr) into cathode-oxide structures to modify their properties. Challenges with introducing secondary elements can include a lack of easy-to-use precursors and/or straightforward synthesis routes as well as difficulty in obtaining uniformity and/or spatial or crystallographic site control of the dopant material.

Thus, there remains a need for a method to modify the surface and/or bulk of Li-ion cathodes as well as for a novel cathode and battery to provide improved properties.

SUMMARY

At least one embodiment relates to a method modifying an electrode. The method comprises providing a lithium carbonate or lithium hydroxide cathode in a reactor; and depositing on the cathode a first material by atomic layer deposition process. The deposition process includes at least one cycle of pulsing a first metal precursor into the reactor for a first metal precursor pulse time, exposing the cathode to the first metal precursor for a first metal precursor exposure time and at a first partial pressure and binding the first metal precursor, purging the reactor of the first metal precursor, pulsing a co-reactant precursor into the reactor for a first co-reactant pulse time, exposing the cathode to the co-reactant precursor for a co-reactant precursor exposure time and at a second partial pressure, the co-reactant precursor reacting with the bound first metal precursor therein to form the first material, and purging the reactor of the co-reactant precursor.

Another embodiment relates to a coated cathode material. The coated cathode material comprises a lithium cathode, a bimetallic coating having a thickness of 0.5 nm to 5.0 nm on the lithium containing cathode, the bimetallic coating comprising a first metal and a second metal, with the lithium containing cathode having as a dopant one of the first metal and the second metal.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

FIGS. 1A-1B are Al-2p (FIG. 1A) and O-1s (FIG. 1B) X-ray photoelectron spectroscopy showing only trimethyl aluminium ("TMA") and $Al_2O_3$ using TMA-$H_2O$, atomic layer deposition ("ALD") precursors deposited on a Mn-rich, cathode-carbonate material at 150° C. (TMA) and at 150° C. and 300° C. ($Al_2O_3$).

FIG. 2A is a cross-sectional SEM-EDAX that confirms Al is present in LLS particles after lithiation and high temperature annealing at 900° C. FIG. 2B shows x-ray diffraction ("XRD") data of samples after lithiation/calcination LLS particles, which shows enhanced spinel formation with treated materials.

FIGS. 3A-3F illustrate a cycling protocol: first-cycle between 4.6 V and 2.0 V, subsequent cycles between 4.45 V and 2.5 V. All cells used Li-metal anodes and were held at 30° C. during cell testing. FIGS. 3A-3D show dQ/dV plots for the initial cycles of LLS final products synthesized from ALD-treated and untreated cathode-carbonates. FIG. 3E shows corresponding discharge capacity vs. cycle number for all LLS materials shown in FIGS. 3A-3D. FIG. 3F shows rate performance of all samples; all capacity values were normalized to the $5^{th}$ cycle capacity and are shown as a percentage in the plot; all charging was carried out at 15 mA/g; discharge currents are labeled in the graph.

DETAILED DESCRIPTION

Figure 4A:
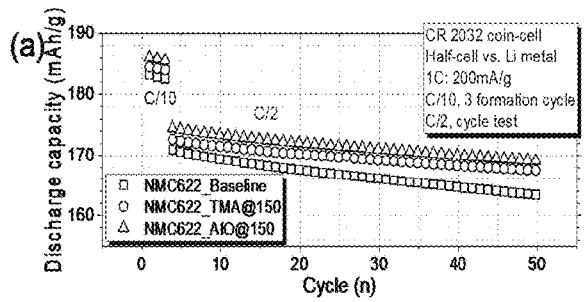
FIGS. 4A-4B show specific discharge capacity vs cycle number for NMC-622 and NMC-811 final products, respectively, synthesized from ALD-treated and untreated (baseline) cathode-hydroxides; final products were formed during annealing in $O_2$ atmosphere at 800° C. for NMC-622 and 750° C. for NMC-811.

Certain embodiments relate to materials and constructs such as cathodes, such as lithium or sodium, and methods of modifying such cathodes. Such materials exhibit novel elemental distribution uniformity through an ALD method that provides uniform elemental distribution both on surface and uniform dopant within the bulk of the material. In one embodiment, a traditional ALD is utilized. ALD is, in its simplest form, a half-reaction, two-step process where a first precursor binds to the surface of the material to be etched (adsorption), the first precursor is purged, and then a second precursor (or co-reactant) is added to react with the adsorbed entity formed by the first precursor. The reaction of the second precursor removes the material deposited by the first precursor reaction, including material from the substrate, such as a single atom of the substrate.

ALD, and variants thereof, provide a technique for achieving modifications such as controlled substitution of secondary elements into lithium ion electrode materials. The methods allow for precise and repeatable control over doping level as well as the ability to introduce secondary elements that are typically hard to realize (e.g., Al-doping of Mn-rich structures). In addition, the methods can be used to enhance the stabilization of surfaces against the effects of unwanted surface reactions that lead to secondary phases (e.g., lithium-carbonates/hydroxides) that are commonly found on certain lithium-ion cathodes, especially when exposed to air. Similarly, oxide bulk and surface properties can be modified through selection of materials, at the oxide and ALD precursor stage, that have tendencies to, for example, migrate towards surfaces during secondary annealing.

In one embodiment, the surfaces being stabilized are cathodes. In particular, some embodiments relate to coating of bare cathode precursors which are non-lithiated and non-calcinated. Which gives the possibilities of not just coating of the bare cathode material but possibilities of various material coatings which are not possible by conventional manner (such as solution based processes). Further, as the ALD precursors are supplied in form of vapor, the distribution is uniform. This allows the use of a wide range of precursors for the same element. For example, for W doping the process can use $WF_6$, $WCl_5$, W(thd), W(amidinate), or the like as precursors for the ALD. All of these precursor have different vapor pressures and some of them show good self-limiting growth behavior vs. non-self-limiting (chemical vapor deposition ("CVD")-like) behavior. Nonetheless, growth of ALD material is done in a controlled manner at an elevated growth temperature. This offers controlling both coating and doping of the desire material on bare non-lithiated cathode materials. For example, once a bare cathode powder is exposed to precursor materials through the ALD process, thereby creating a uniform distribution of the precursor elements over the cathode surface, subsequent heat treatments can drive the elements into the bulk of the cathode as dopants.

The material deposited by ALD may ultimately reside in several forms and positions on and within the cathode. First, materials deposited by ALD are, ideally, uniformly deposited on the surface of substrates (e.g., cathode particles). Subsequent heat treatments can cause the migration of the coating elements into the bulk of cathode structures as dopants. In one embodiment, temperatures for heat treatments are in the range of 300° C.-1000° C. The temperature for heat treatment may be selected depending on the precursor treatment and temperature at which the coating materials and/or the cathode breaks down. Second, the ALD coating (e.g., $TiO_2$ using precursors $TiCl_4$—$H_2O$) may not move to the core of the cathode material due to strong ALD material interaction only at the surface cathode materials (not in the bulk). Third, in other embodiments, some of the component of the ALD coating can move into cathode material. For example, AlTiO coating on cathode material, in this case Al may move into cathode material and this will leave $TiO_2$ on surface after the calcination step. Fourth, in one embodiment, a follow-up lithiation step may also change the Li-distribution in the cathode, which results in a new structural formation.

In one embodiment, 'dopants' refers to a concentration at 5% or less. One of skill in the art will appreciate that to accomplish a dopant in the bulk, the cathode composition and the precursor for the dopant material should be selected to match oxidation state. For example, Al cations are $3^+$ and can easily integrate into a material like $LiCoO_2$ where all the Co is $3^+$. However, Ti, which is $4^+$ in $TiO_2$ would not be as favorable and is more likely to form $TiO_2$ at the surface or grain boundaries rather than substituting in the bulk sites as elemental Ti. So if $LiCoO_2$ were treated with Al/Ti, it would be expect that more Al doping than Ti. Thus, in one embodiment one deposited material forms a dopant within the bulk while another does not for the same material, for example any combination containing one ALD precursor element that can substitute into the bulk sites of a particular cathode, and another that that does not. For example, Mg/Ti, Ga/Ti or, as a further nonlimiting example, Al/P, Ni/P . . . M/P. Further, it should be appreciated that typical calcination limitations may apply, such as the parameters of the calcination limiting the amount of dopant that can penetrate the bulk. For example, if the weight % of the Al precursor is high, one will only get so much doping after calcination before oxidation, for example Al-oxides, at the surfaces in combination with Ti (AlxTiyOz) prevent further migration into to the bulk. The deposited material that is matched with the cathode material (e.g., Al for a $LiCoO_2$ cathode) would only migrate into the structure after calcination and accordingly the extent of migration depends on calcination parameters (time, temp, atmosphere, etc.).

For example, the parameters that will control the ALD material penetration (dopant) into solid are crystallographic structure, thermodynamic stability of the ALD material, thermodynamic stability of the core materials, the Nature of ALD material precursor. For example, $TMA-H_2O$ can give $AL_2O_3$ and upon calcination which can doped all surface Al in to, core but TMA-HF pyridine may result in $AlF_3$ Stable form that may doped partially Al in core. In another example 10 cycles of $TMA-H_2O$ at 200° C. can give 1.0 nm (250 ppm) of $Al_2O_3$ and upon calcination which can doped all surface Al in to core, whereas 10 cycles of $AlCl_3$ and $Al(OiPr)_3$ at 200° C. can give 1.4 nm of $Al_2O_3$ and upon calcination Al dopant % can be different.

Herein, the ALD method is described in the context of an exemplary embodiment using the deposition of ALD precursors on Mn-rich, LLS carbonate cathode precursors (hereafter "cathode-carbonate"), and nickel-rich hydroxide cathode precursors (hereafter "cathode-hydroxide"), followed by lithiation during calcination. In one embodiment, the Mn rich LLS carbonate has a Ni:Mn:Co ratio of about 3:5:2, such as 0.28:0.53:0.19. LLS material and details can be found in Long, et al., "*Advances in Stabilizing 'Layered-Layered' $xLi_2MnO_3 \cdot (1-x)LiMO_2$ (M=Mn, Ni, Co) Electrodes with a Spinel Component*," Journal of the Electro Chemical Society 161(14), pp. A2160-A2167 (2014), incorporated herein by reference. In some of the examples below, the nickel-hydroxide final product (after ALD and lithiation/calcination) was exposed to air to reveal the benefits of the treatment (e.g., resistance to surface impurity-related performance degradation). While the examples and embodiments herein generally refer to a substrate upon which the ALD is applied to deposit a coating, it is also possible to expose an untreated substrate, such as LLS material to, for example, air, where surface impurities will form. After which, the ALD technique can be applied and ALD precursors can react with the surface phases (e.g., $Li_2CO_3/LiOH$) to form a lithiated phase that can protect the surface. For example, Al-based precursors can react with surface lithium to form lithium-Al surface phases.

Figure 6:
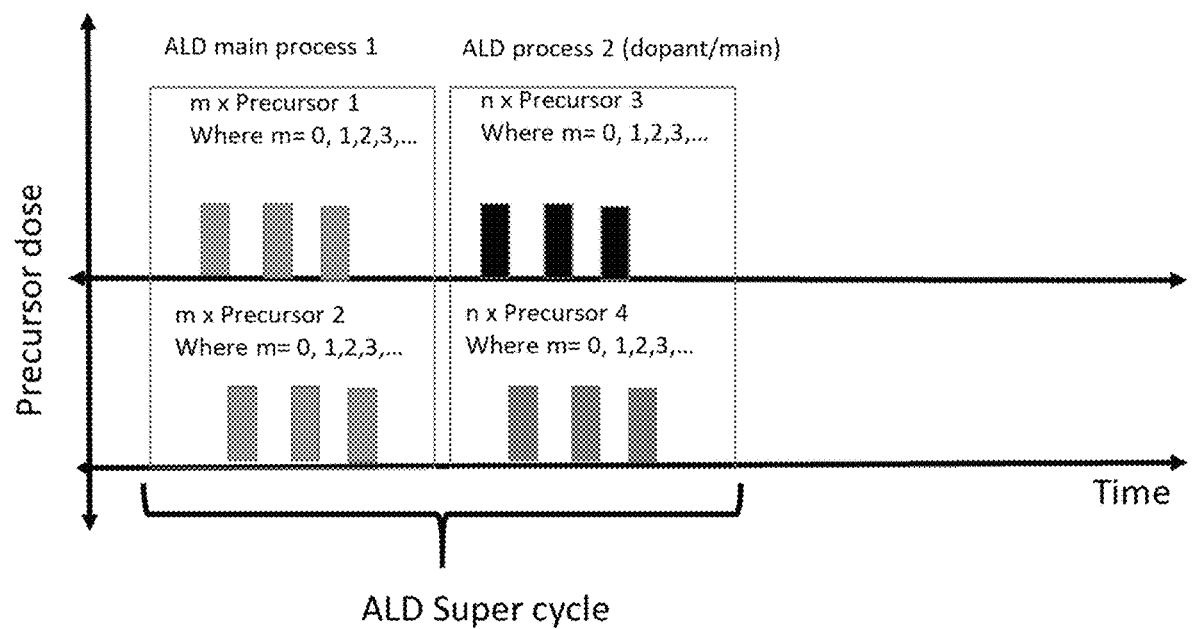
FIG. 6 shows one embodiment of a deposition of two materials using an ALD supercycle.

In one embodiment, each ALD process consists of a cycle, which may be repeated to form a supercycle, with a first metal precursor vapor pulse, such as TMA for modification with aluminum (e.g., for 5 seconds), followed by a first metal exposure (e.g., for 30 seconds) in a sealed vacuum valve, followed by a first metal precursor purge (e.g., for 1 second) where the reactor is pumped to a vacuum, followed by a co-reactant pulse, such as water (e.g., for 1 second) with a co-reactant exposure (e.g., for 1 second), followed by a co-reactant purge (e.g., for 1 second). It should be appreciated that more complicated ALD schemes can be constructed as a supercycle comprising various subcycles for depositing a material as described or for depositing multiple different materials for multiple dopants or formation of bi (tri, etc.) metallic materials, such as varying the parameters for any of the individual steps within a cycle. FIG. 6 illustrates one embodiment where two ALD depositions are used in a sequence as a ALD super cycle to deposit two different materials.

The described ALD process involves the reaction of the first metal precursor and the co-reactant precursor on the electrode to result in the deposition of the respective metal oxide $Al_2O_3$. As a result, the stoichiometric variations in the resultant Li-ion electrode can be controlled by the parameters of the ALD, including the number of cycles. Further, stoichiometric variations can be achieved by the use of different precursors.

In some embodiments, the first metal precursor vapor pulse comprises input to the reactor of the first metal precursor vapor for a first metal precursor vapor pulse time of 1 seconds to 100 seconds based on the surface area of the core battery material (e.g., 0.5, 1, 5, 10, 20, or 30 seconds, inclusive of all ranges and values therebetween), such as 5 seconds. This time is depend on the surface area of the bare cathode materials. The first partial pressure of the first metal precursor vapor pulse can be in the range of 0.01 Torr to 10,000 Torr (e.g., 10, 25, 50, 75, 100, 500, or 1000 Torr, inclusive of all ranges and values therebetween), such as, in one embodiment, at least 0.5 to 100 Torr. One of skill in the art will appreciate that the time length, pressure, and amount of precursor for the pulse are all factors in determining the overall amount for each of those operation parameters. For example, the pressure and amount may follow from the duration of the pulse but depend on the size of the chamber and the type of valve as would be understood from general knowledge regarding ALD. Note, for ease of reference herein the process is described with regard to the pulse duration but it is understood that the precursor partial pressure is what dictates the diffusion boundary conditions.

In some embodiments, the first metal precursor exposure comprises exposing the base material to the first metal precursor for a first metal exposure time and a first partial pressure of the first metal precursor so that the first metal precursor infiltrates at least a portion of the base material (e.g., infiltrates beneath the surface) and binds with the base material. The first metal exposure time can be in the range of 0.5 seconds to 500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween). In some embodiments, the first predetermined time is in the range of 1 and 10 seconds (e.g., about 5 seconds). The first partial pressure of the first metal precursor can be in the range of 0.01 Torr to 10 Torr (e.g., 0.01, 0.05, 0.1, 0.5, 1.0, 5.0, or 10 Torr, inclusive of all ranges and values therebetween). In some embodiments, the first partial pressure of the first metal precursor is in the range of 0.1 Torr and 1 Torr (e.g., about 0.5 Torr).

The first metal precursor purge evacuates unreacted precursor from the reactor. The first metal precursor purge may be for a first metal precursor purge time of 0.5 seconds to 30 seconds (e.g., 0.5, 1, 5, 10, 20, or 30 seconds, inclusive of all ranges and values therebetween), such as 5 seconds. The first metal precursor purge reduces the pressure in the reactor to within the range of 0.01 Torr to 10 Torr (e.g., 0.01, 0.05, 0.1, 0.5, 1.0, 5.0, or 10 Torr, inclusive of all ranges and values therebetween), such as substantially to vacuum.

In some embodiments, the base material can be heated to a predetermined temperature during the ALD process. For example, the first predetermined temperature can be in the range of 50-200° C. (e.g., 50, 60, 70, 80, 90, 100, 110, 120, 130, 140, 150, 160, 170, 180, 190 or 200° C., inclusive of all ranges and values therebetween). In some embodiments, the predetermined temperature is in the range of 70-90° C. (e.g., 85° C.). In some embodiments, the first predetermined temperature can be in the range of 120-140° C. (e.g., 135° C.). Temperature also impacts the overall energy in the system and the performance for diffusion and/or reaction.

In some embodiments, first metal precursor includes, for example, trimethyls, triethyls, or acetylacetonates of the group beta-diketonates. For example, the first metal precursor may be TMA.

The base material, after reaction with the first metal precursor, is then exposed to a second precursor—the co-reactant precursor—by a co-reactant pulse introducing the co-reactant to the reactor and then exposing for the co-reactant exposure such that the second co-reactant precursor reacts with the first metal precursor.

In some embodiments, the first metal precursor vapor pulse comprises input to the reactor of the first metal precursor vapor for a co-reactant precursor pulse time of 0.5 seconds to 30 seconds (e.g., 0.5, 1, 5, 10, 20, or 30 seconds, inclusive of all ranges and values therebetween), such as 2 seconds. The first partial pressure of the co-reactant precursor pulse can be in the range of 0.01 Torr to 10 Torr (e.g., 0.01, 0.05, 0.1, 0.5, 1.0, 5.0, or 10 Torr, inclusive of all ranges and values therebetween).

In some embodiments, exposing the electrode to the co-reactant precursor for a co-reactant precursor exposure time and a second partial pressure of the co-reactant precursor so that the co-reactant precursor reacts with the moiety formed by the first metal precursor reacting with the base material. The co-reactant precursor exposure time can be in the range of 0.5 seconds to 500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as about 60 seconds. The second partial pressure of the co-reactant precursor can be in the range of 0.01 Torr to 10 Torr (e.g., 0.01, 0.05, 0.1, 0.5, 1.0, 5.0, or 10 Torr, inclusive of all ranges and values therebetween). In some embodiments, the second partial pressure of the co-reactant precursor is in the range of 0.1 Torr and 1 Torr (e.g., about 0.5 Torr).

The co-reactant precursor purge evacuates unreacted precursor from the reactor. The co-reactant precursor purge may be for a co-reactant precursor purge time of 0.5 seconds to 500 seconds (0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as 120 seconds. The co-reactant precursor purge reduces the pressure in the reactor to within the range of 0.01 Torr to 10 Torr (e.g., 0.01, 0.05, 0.1, 0.5, 1.0, 5.0, or 10 Torr, inclusive of all ranges and values therebetween), such as substantially to vacuum.

In some embodiments, the second co-reactant precursor may include one or more of water, hydrogen peroxide, and ozone. Note, varying the co-reactant may also vary the stoichiometry of the resultant modified electrode. Further precursors may include nitrous oxide, hydrogen, formaldehyde, trimethyl aluminum, ammonia, hydrazine, dimethyl hydrazine, diethyl hydrazine, methyl-ethyl hydrazine, hydrogen sulfide, trimethyl phosphite, trimethyl phosphate, silane, disilane, or any combination thereof. For example, the first metal precursor can be TMA and the second co-reactant can be water.

Any number of cycles of exposing the base material to the first metal precursor and the second co-reactant precursor can be performed to reach a depth within the base material that the inorganic material has infiltrated as well as amount of inorganic material deposited therein. In some embodiments, the number of cycles of the ALD process can be in the range of 1-50 (e.g., 1 cycle, 2, 3, 4, 5, 10, 15, 20, 25, 30, 35, 40, 45, or 50 cycles, inclusive of all ranges and values therebetween). For embodiments providing a coating on the cathode, the thickness of the ALD coating may be between 0.5 nm and 5 nm. In one embodiment where the ALD coating is processed such as to provide a dopant to the bulk of the cathode, the dopant level may be less than 5% or less than 1% by mass or 10-500 ppm. For example, 3 cycles of ALD in an embodiment depositing aluminum as a dopant may correspond to ~1% Al dopant.

Following the modification by ALD, the modified material undergoes lithiation/calcination in one embodiment. In one embodiment, calcination is required in order to lithiate the coated cathode precursors (e.g., LLS cathode-carbonates) and form a final cathode product. However, ALD modified cathode-carbonates/hydroxides may themselves be calcined in any controlled atmosphere, oxidizing or reducing (e.g., $O_2$, Dry air, $N_2O$, $NH_3$, inert $N_2$, Ar), in the absence of lithium, prior to the lithiation step. Typical temperatures would be ~100-1200° C. (e.g., 500° C.-1200° C.).

The calcination may be selected to provide a desired stabilization to the cathode. For example, stabilization of the bulk cathode by the deposited ALD material may require a temperature of 450° C.-900° C. while surface stabilization by a dopant ALD deposition may be achieved at a lower temperature (100° C.-600° C.).

Subsequent lithiation of ALD-treated cathode-carbonates/hydroxides (that have been calcined or not between ~100-1200° C.) is typically done by calcination in the presence of a lithium source (lithium carbonate or lithium hydroxide) between ~400° C.-1000° C.

In addition, if the ALD technique is applied to a final cathode product, additional calcination may be performed on the ALD-treated final product in the same range of temperatures and atmospheres. It is well-known in the art that varying the calcination time, temperature, and atmosphere plays an important role and is, in general, an optimization process dependent on the composition of the material and the desired outcome. For example, if a final cathode product is treated with an ALD precursor element (e.g., Al), that precursor element might be substituted into the surface by low temp/short-time calcination. However, the same precursor element could be driven into the bulk of the material by higher-temp/longer time calcination.

The materials of this invention can be extended to other substitutional elements of interest (e.g., B, K, Zn, Zr, Ti, Mg, Ga, Mo, W, Ta, Nb, Ru) and is envisioned to include any element in precursor form suitable for ALD deposition techniques, including fluorides, oxides, sulphides, as well as combinations and lithiated derivatives thereof. Careful control over the ALD deposition and subsequent treatment parameters, such as precursor types (e.g., ALD, cathode-carbonate, and cathode-hydroxide), time, temperature, and atmosphere can influence material performance, phases formed, and the degree of bulk vs. surface concentration of dopants. As such, surface modifications also fall under this method. It is believed that the method described herein will be applicable across various materials applications such as fuel cells, solid state electrolytes, and others where precursor chemistries play a role before reaching a final product.

EXAMPLES

Examples of possible coating materials include but are not limited to: $Al_2O_3$, MgO, $TiO_2$, $ZrO_2$, $HfO_2$, $Ga_2O_3$, GaN, MoN, WN, WZnO, $In_2O_3$, $SnO_2$, $MnO_2$, $MoS_2$, $WS_2$, $GaS_2$, $MgS_2$, $HfS_2$, BAlO, HMO, $Gd_2O_3$, $Li_2O$, LiOH, $LiCO_3$, $Li_2S$, LiF, $B_2O_3$, $Al_xB_{(1-x)}O_y$, $MgF_2$, $Al_2S_3$, $AlPO_4$, $SiO_2$, $P_2O_3$, $CaF_2$, TiN, N—$TiO_2$, $V_2O_5$, Fe, $Fe_2O_3$, $Fe_2S_3$, Co, $Co_3O_4$, NiO, Cu, CuO, $Cu_2S$, CuS, ZnO, ZnS, $Ga_2S_3$, SrO, $Y_2O_3$, ZrN, $Nb_2O_3$, $NbC_xN_y$, $NbSi_x$, Mo, $MoO_3$, $MoAlC_xF_y$, Ru, $RuO_2$, Pd, PdO, CdO, CdS, $In_2S_3$, SnS, Sb, $Sb_2O_3$, $Sb_2S_3$, BaO, $HfBO_x$, TaN, $TaC_xN_y$, W, $WO_3$, $WAlC_xF_y$, $ReAl_2O_3$ $CH_3$, Ir, $IrO_2$, Pt, PtO, $Bi_2O_3$, $CeO_2$, $Sm_2O_3$, $Sm_2S_3$, $Tb_2O_3$, Al—ZnO, B-ZnO, F—$SnO_2$, Zn—$SnO_2$, ITO, $LiAlS_x$, $LiGaS_x$, $LiAlO_x$, $LiGaO_x$, $CuZnSnS_x$, YSZ, YBCO, Pt—Ir, Pt—Pd, Pt—Ru, Pd—Ru, W—Mo, alucone, lithicone, zincone and for exposure of only one precursor: TMA, $AlCl_3$, TMB, $TiCl_4$, $H_2S$, $WF_6$, $MoF_6$, TMG, TMIn, $BF_3$, $B_2F_4$, DEX, etc. Samples were prepared in accordance with the methods above.

All cathode-carbonates/hydroxides were prepared via the well-known method of co-precipitation using continuously stirred tank reactors ("CSTR") as described in Croy, et al., *"Prospects for spinel-stabilized, high-capacity lithium-ion battery cathodes,"* Journal of Power Sources 334, pp. 213-220 (2016), and Wang, et al., *"Synthesis of high capacity cathodes for lithium-ion batteries by morphology-tailored hydroxide co-precipitation,"* Journal of Power Sources 274, pp. 451-457 (2015).

The resultant samples were then tested by a variety of techniques. FIGS. 1A-1B show Al-2p (FIG. 1A) and O-1s (FIG. 1B) XPS of Mn-rich, cathode-carbonate precursor materials after ALD deposition of TMA and TMA plus water to produce AlO. The data show that 1) Al was deposited on the separate batches of the material at the same level and 2) differing the ALD parameters leads to unique chemical environments, thus, allowing another degree of control based on deposition conditions. Elemental analysis through inductively coupled plasma optical emission spectroscopy ("ICP-OES") of the TMA-150° C. sample revealed a composition of $Mn_{0.56}Ni_{0.24}Co_{0.19}Al_{0.01}CO_3$.

Lithium- and manganese-rich LLS cathode particles were prepared as final products by firing the treated and untreated cathode-carbonates of FIGS. 1A-1B at 900° C. for 20 hours in the presence of $Li_2CO_3$. FIG. 2A shows a cross-sectional scanning electron microscopy ("SEM") confirming that Al is present in the AlO-300° C. sample after annealing. Additionally, ICP-OES of the annealed TMA sample revealed a composition of Li1.23Mn0.56Ni0.24Co0.19Al0.0Oy also confirming the presence of Al. The XRD patterns of three calcined samples (baseline LLS, TMA and AlO-300° C., FIG. 2B) reveals that both the TMA-150° C. and AlO-300° C. contain a clear signature of spinel formation that is not obvious in the untreated baseline. For the baseline LLS electrodes, it has been shown that integrating a spinel component at the nanoscale during synthesis results in small domains which can be incoherent in diffraction data depending on synthesis conditions (Long, et al., "Advances in Stabilizing 'Layered-Layered' $xLi_2MnO_3 \cdot (1-x)LiMO_2$ (M=Mn, Ni, Co) Electrodes with a Spinel Component," Journal of the Electro Chemical Society 161(14), pp. A2160-A2167 (2014)). Clearly, the treatment of the cathode-carbonate by several different ALD precursors induced structural changes in the final, lithiated cathode powder. In addition, the AlO treatment induced more spinel formation showing that the final product can be further tuned by modifications made at the ALD treatment stage.

FIGS. 3A-3F show cycling data of the LLS final products synthesized from ALD-treated and untreated cathode-carbonate materials. FIGS. 3A-3D show the dQ/dV for each of the samples. Each material exhibits the expected activation peak ~4.5 V during the first cycle and a redox reaction centered near 3.8 V during all other cycles. As can be seen in FIG. 3E, the different ALD precursor treatments result in different performances of the final materials. Of significance is the performance difference between the two AlO samples using different deposition temperatures (150° C. vs. 300° C.). This result highlights the flexibility of the ALD treatment process to modify the cathode material and in turn the electrochemical performance. Lastly, FIG. 3F compares the rate capability of the treated samples vs the baseline cathode. There is little difference between the samples when moderate currents are used but the TMA-150° C. sample outperforms all other samples as higher currents are applied. This result again highlights the significance of ALD precursor selection/deposition parameters in modifying performance of the final product (e.g., rate).

Figure 4B:
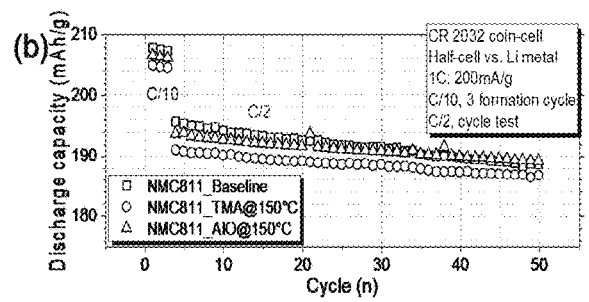
Figure 4C:
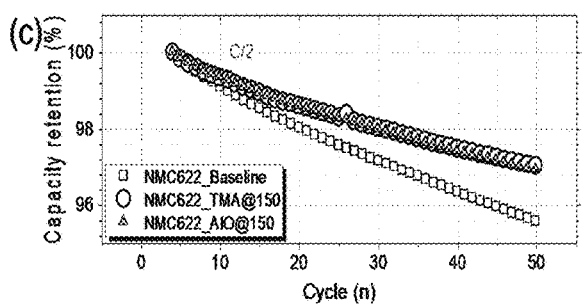
FIGS. 4C-4D show corresponding capacity retentions at a C/2 rate for the samples in FIGS. 4A-4B respectively. The capacity retention was normalized to initial discharge capacity at the C/2 rate after 3 formation cycles at C/10. All cells used Li-metal anodes were held at 30° C.
Figure 4D:
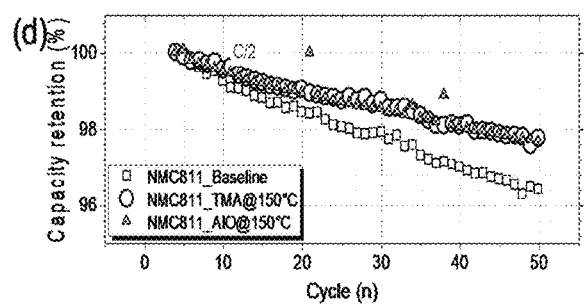

FIGS. 4A-4B show capacity vs. cycle number for NMC-622 and NMC-811 final products synthesized from cathode-hydroxide precursors ALD-treated with the AlO and TMA under deposition at 150° C. The data show the average of 3 cells for each cathode. All samples capacities are within ~5 mAh/g revealing that the treatment has not hindered deliverable capacity. Furthermore, as shown in FIGS. 4C-4D, each of the treated NMCs (NMC-622 and NMC-811) display enhanced capacity retention with respect to the untreated baseline, revealing an advantage of the final products synthesized from the ALD-treated, cathode-hydroxides.

Figure 5A:
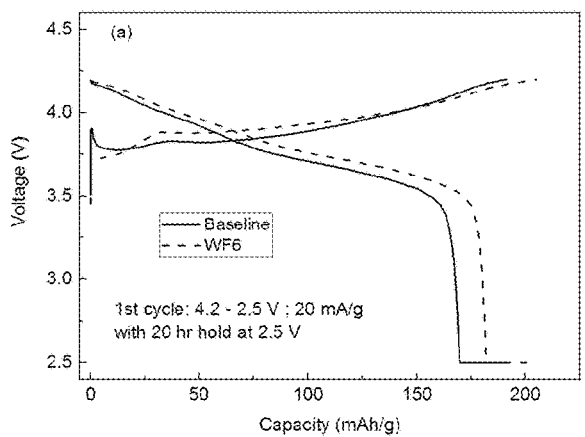
FIGS. 5A-5B show voltage profiles (vs. Li/Li$^+$) of a Ni-rich lithium-nickel-manganese-cobalt-oxide (LiNiMn-$CoO_2$) ("NMC") final product synthesized from WF$_6$-treated (via ALD procedures) and untreated cathode-hydroxides having metal ratios of Ni:Mn:Co=85:05:10. The profiles shown are for the (a) $1^{st}$ cycle: 4.2-2.5 V (FIG. 5A) and $6^{th}$ cycle: 4.5-2.5 V (FIG. 5B). All cycling was collected using Li-metal anodes at 30° C. with 20 mA/g applied current.
Figure 5B:
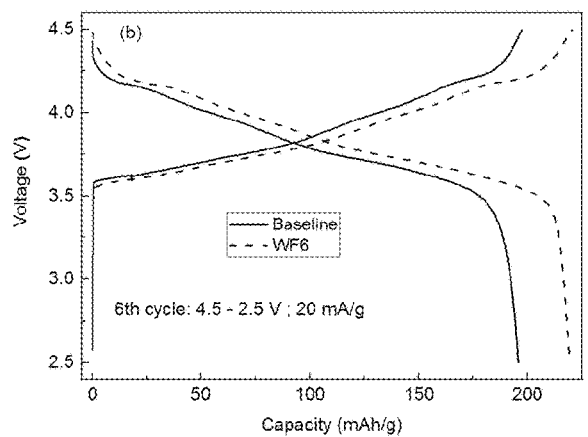

A Ni-rich NMC cathode-hydroxide with nominal composition Ni:Mn:Co=85:05:10 was treated via 1 ALD cycle using a tungsten hexafluoride ($WF_6$-treated) precursor. Both the treated ($WF_6$) and untreated samples were then lithiated/calcined in $O_2$ atmosphere at 730° C. for 10 hours in the presence of $LiOH \cdot H_2O$ to produce the final cathode products. The final products were then exposed to air for two weeks. XRD analysis of the $WF_6$ and baseline NMC showed no evidence (not shown) of crystalline lithium carbonate. However, observed in the first charge profile of FIG. 5A is a large, characteristic spike related to the decomposition of unwanted surface phases (e.g., Li-carbonates) that are known to form on air-exposed cathodes. For the $WF_6$-treated sample, the characteristic decomposition peak is not present and the overall shape of the charge curve is modified. FIG. 5B shows the charge/discharge curves of the samples during the $6^{th}$ cycle, conducted between 4.5 V and 2.5V (vs. $Li/Li^+$).

The data reveal that the $WF_6$-treated sample has less overpotential and significantly more capacity in the same voltage window as the baseline sample. These data reveal that treating the cathode, at the cathode-hydroxide stage, via the ALD-based processes (e.g., only 1 cycle in this case), has a clear and positive impact on the performance of the cathode, even after prolonged exposure to air.

Definitions.

No claim element herein is to be construed under the provisions of 35 U.S.C. § 112(f), unless the element is expressly recited using the phrase "means for."

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or movable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. For example, circuit A communicably "coupled" to circuit B may signify that the circuit A communicates directly with circuit B (i.e., no intermediary) or communicates indirectly with circuit B (e.g., through one or more intermediaries).

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the figures. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above.

What is claimed is:

1. A method of modifying a cathode comprising:
providing a lithium carbonate or lithium hydroxide cathode precursor in a reactor; and
depositing on the cathode precursor a first material by atomic layer deposition process including at least one cycle of:
pulsing a first metal precursor into the reactor for a first metal precursor pulse time;
exposing the cathode precursor to the first metal precursor for a first metal precursor exposure time and at a first partial pressure and binding the first metal precursor;
purging the reactor of the first metal precursor;
pulsing a co-reactant precursor into the reactor for a first co-reactant pulse time;
exposing the cathode precursor to the co-reactant precursor for a co-reactant precursor exposure time and at a second partial pressure, the co-reactant precursor reacting with the bound first metal precursor therein to form the first material; and
purging the reactor of the co-reactant precursor;
wherein the cathode precursor prior to deposition is non-calcinated and non-lithiated.

2. The method of claim 1, further comprising calcinating the cathode precursor after depositing of the first material.

3. The method of claim 2, wherein the calcinating is at a temperature in the range of 300° C. to 1000° C.

4. The method of claim 1, wherein the cathode precursor comprises a metallic element with a first oxidation state.

5. The method of claim 4, wherein the cathode precursor comprises $LiCoO_2$ or LiOH.

6. The method of claim 4, wherein the first material comprises an ALD deposited metallic element having the first oxidation state.

7. The method of claim 5, wherein the first material comprises aluminum.

8. The method of claim 1, depositing a second material by atomic layer deposition process including at least one cycle of:
pulsing a second metal precursor into the reactor for a second metal precursor pulse time;
exposing the cathode precursor to the second metal precursor for a second metal precursor exposure time and at a second metal precursor partial pressure and binding the second metal precursor;
purging the reactor of the second metal precursor;
pulsing a second co-reactant precursor into the reactor for a second co-reactant pulse time;
exposing the cathode precursor to the second co-reactant precursor for a second co-reactant precursor exposure time and at a second partial pressure, the co-reactant precursor reacting with the bound first metal precursor therein to form the second material and
purging the reactor of the co-reactant precursor.

9. The method of claim 8, wherein the second material comprises an ALD deposited metallic element having the second oxidation state that is different from the first oxidation state.

10. The method of claim 8, wherein following calcination, the first material forms a first material dopant within the cathode precursor bulk and the second material is not a dopant.

11. The method of claim 1, further comprising, following or during calcination, lithiation of the coated cathode precursor to form a modified cathode.

12. The method of claim 1, wherein the cathode precursor comprises a manganese-rich layered-layered spinel carbonate, a nickel-rich hydroxide, or a mixture thereof.

* * * * *